US009413340B1

(12) United States Patent
Katikaneni et al.

(10) Patent No.: US 9,413,340 B1
(45) Date of Patent: Aug. 9, 2016

(54) DC-TO-DC VOLTAGE CONVERTER USING SWITCHING FREQUENCY DETECTION

(71) Applicant: FIDELIX CO., LTD., Seongnam-si, Gyeonggi-do (KR)

(72) Inventors: Pradeep Katikaneni, Plano, TX (US); Won Eung Kim, Plano, TX (US)

(73) Assignee: FIDELIX CO., LTD., Seongnam-Si, Gyeonggi-Do (KR)

( * ) Notice: Subject to any disclaimer, the term of this patent is extended or adjusted under 35 U.S.C. 154(b) by 0 days.

(21) Appl. No.: 14/704,010

(22) Filed: May 5, 2015

(51) Int. Cl.
*H02M 3/156* (2006.01)
*H03K 3/017* (2006.01)
*H03L 7/089* (2006.01)
*G05F 1/575* (2006.01)

(52) U.S. Cl.
CPC ................ *H03K 3/017* (2013.01); *G05F 1/575* (2013.01); *H03L 7/0891* (2013.01)

(58) Field of Classification Search
CPC ..... H02M 3/156; H02M 3/155; H02M 3/157; H02M 5/1563; G05F 1/56; G05F 1/575
USPC .......................... 323/280, 282, 283, 284, 351
See application file for complete search history.

(56) References Cited

U.S. PATENT DOCUMENTS 5,705,919 A * 1/1998 Wilcox ................... G05F 1/618 323/268
6,100,677 A * 8/2000 Farrenkopf ............. H02M 1/36 323/282
6,181,120 B1 * 1/2001 Hawkes ................ H02M 3/156 323/282
6,229,289 B1 * 5/2001 Piovaccari .......... H02M 3/1588 323/268
7,385,379 B2 * 6/2008 Aioanei .............. H02M 3/1588 323/282
7,710,092 B2 * 5/2010 Chapuis ................ H02M 3/157 323/282
7,724,553 B2 * 5/2010 Wong .................... H02M 3/156 323/282
7,990,119 B2 * 8/2011 Petty ..................... H02M 3/156 323/268
8,493,044 B2 * 7/2013 Xu ...................... H02M 3/1584 323/271
8,803,495 B2 * 8/2014 Nguyen .................. H02M 1/36 323/282
8,884,592 B2 * 11/2014 Mirea ................. H02M 3/1563 323/271
8,928,300 B2 * 1/2015 Xi ......................... H02M 3/156 323/282
2009/0140708 A1 6/2009 Tateishi et al.
2010/0110738 A1 * 5/2010 Shimizu .............. H02M 1/4225 363/124
2011/0169464 A1 * 7/2011 Michishita .......... H02M 3/1563 323/271

* cited by examiner

*Primary Examiner* — Adolf Berhane
(74) *Attorney, Agent, or Firm* — Kile Park Reed & Houtteman PLLC

(57) ABSTRACT

A DC-to-DC voltage converter using switching frequency detection is provided. The DC-to-DC voltage converter includes a voltage conversion block including a power switch configured to be turned on in response to a power driving signal and to provide an input supply voltage to be output as the converted output voltage when the power switch is turned on, wherein the converted output voltage has a level that varies depending on a duty cycle of the power driving signal, and a switching control block that receives the converted output voltage and a feedback signal to control the duty cycle of the power driving signal based on a frequency of a feedback signal, the feedback signal having the same period as the power driving signal. Accordingly, when the level of the input supply voltage is changed, the converted output voltage can be recovered to the target level while the switching frequency of the power driving signal is maintained at the same value as before the change of the level of the input supply voltage. Electronic devices adopting the DC-to-DC voltage converter can be strong against an electromagnetic interference phenomenon and have improved performance in a low frequency band.

18 Claims, 5 Drawing Sheets

DC-TO-DC VOLTAGE CONVERTER USING SWITCHING FREQUENCY DETECTION

BACKGROUND

1. Field of the Invention

The present invention relates to a direct current to direct current (hereinafter, "DC-to-DC") voltage converter, and more particularly, to a DC-to-DC voltage converter capable of achieving duty control and switching frequency stabilization using switching frequency detection.

2. Discussion of Related Art

A conventional DC-to-DC voltage converter provides an input supply voltage as a converted output voltage having an appropriate level and such DC-to-DC voltage converter has been used in various electronic devices such as a cellular phone, a radio frequency (RF) communication device, etc. In general, a DC-to-DC voltage converter requires a method of regulating its output voltage to have a target level in consideration of changes of output loading condition and a ratio between input and output voltages.

Such output voltage regulation method can be performed by a voltage mode control (VMC) method and/or a current mode control (CMC) method in a linear control type.

The voltage mode control method is for controlling an output voltage by directly feeding a level of a converted output voltage back to driving circuits. Since the voltage mode control method performs in a low response speed with respect to change of the output voltage, it has a disadvantage of a great voltage drop while the load is changed significantly.

And, the current mode control method is for regulating an output voltage by detecting current change of an upper or lower switch. The current mode control method has advantages of having a high response speed with respect to the change of the converted output voltage, but disadvantages such that it requires complicated current sensing circuit to ensure stability.

Besides the linear control type, time or frequency based nonlinear control methods also have been developed. The nonlinear control methods would be advantageous since they have a high response speed with respect to the change of the converted output voltage and they are easy to be implemented in a circuit. However, the conventional nonlinear control methods are disadvantageous such that a switching frequency varies along the input and output conditions. This switching frequency variation causes difficulty in handling an electromagnetic interference (EMI) phenomenon and degradation of system performance when the switching frequency moves into a low frequency band. Recently some other technics are introduced in the nonlinear control methods, but the control is still very sensitive to external conditions.

SUMMARY OF THE INVENTION

The present invention is directed to a DC-to-DC voltage converter based on switching frequency detection capable of stabilizing an output voltage and a switching frequency by effectively controlling a duty cycle using simple switching frequency detection.

According to an aspect of the present invention, there is provided a DC-to-DC voltage converter including a voltage conversion block that receives an input supply voltage from a power supply and outputs a converted output voltage, the voltage conversion block including a power switch configured to be turned on in response to a power driving signal and to provide the input supply voltage to be output as the converted output voltage when the power switch is turned on, wherein the converted output voltage has a level that varies depending on a duty cycle of the power driving signal, and a switching control block that receives the converted output voltage and a feedback signal to control the duty cycle of the power driving signal based on a frequency of the feedback signal, wherein the feedback signal and the power driving signal have a same period.

The switching control block may include a setting clock generation unit that receives the converted output voltage and the power driving signal to generate a setting clock signal, wherein the setting clock signal has a setting period when the level of the converted output voltage is a first level, a period of the setting clock signal is changed when the level of the converted output signal is changed from the first level to a second level, and the period of the setting clock signal is recovered to the setting period when the converted output voltage is recovered to the first level; an on-time control unit that receives the feedback signal to generate a reset driving signal, wherein an activation time of the reset driving signal varies depending on a frequency of the feedback signal; and a driving control unit that receives the setting clock signal and the reset driving signal to generate the power driving signal, wherein the power driving signal is activated in response to the setting clock signal and is deactivated in response to the reset driving signal.

The setting clock generation unit may include an output voltage reflector that receives the converted output voltage and a reference voltage to provide a reflection voltage, wherein a level of the reflection voltage varies depending on the level of the converted output voltage; a waveform generator that receives the power driving signal to generate a reference waveform signal, wherein the reference waveform signal is repeatedly generated by a predetermined period and has a level changing in one direction by lapse of time; and a setting clock generator that receives the reflection voltage and the reference waveform signal to generate the setting clock signal, wherein the setting clock signal is controlled based on a comparison result of the reflection voltage and the reference waveform signal. The output voltage reflector may include a voltage divider that receives the converted output voltage to generate a divided voltage; and a reflection comparator that receives the divided voltage and the reference voltage to generate the reflection voltage by performing a comparison with respect to the divided voltage and the reference voltage. The waveform generator may include a level shifter that receives the power driving signal to shift a level of the power driving signal; a driver that receives and drives an output of the level shifter to provides the reference waveform signal to the setting clock generator; and a waveform capacitor disposed at an output of the driver to be charged with a charge of the output of the level shifter. The setting clock generator may include a setting comparator that receives the reflection voltage and the reference waveform signal to generate the comparison result of the reflection voltage and the reference waveform signal; and an AND gate that receives an output signal of the setting comparator and a ready signal to generate the setting clock signal, wherein the output signal of the setting comparator is generated as the setting clock signal in a state that a ready signal is activated.

The on-time control unit may include a reference clock generator configured to generate a reference clock signal; a frequency error detector that receives the reference clock signal and the feedback signal to generate a frequency error signal, wherein a voltage level of the frequency error signal is changed based on a comparison result of a frequency of the reference clock signal and a frequency of the feedback signal; and an on-time comparator that receives an on-time voltage and the frequency error signal to generate the reset driving signal by comparing a level of the on-time voltage and a level of the frequency error signal, wherein the level of the on-time voltage is changed in one direction by lapse of a time, and the activation time of the reset driving signal varies depending on the level of the frequency error signal. The reference clock generator may include an oscillator configured to generate an oscillation signal oscillating with a predetermined frequency; and a multiplier that receives the oscillation signal and multiplies a frequency of the oscillation signal by a multiplication rate to generate the reference clock signal having a reference frequency. The frequency error detector may include a frequency detector that receives the reference clock signal and the feedback signal to detect the frequencies of the reference clock signal and the feedback signal and generate an up pulse signal and a down pulse signal, wherein the up pulse signal is activated when the frequency of the feedback signal is higher than the frequency of the reference clock signal, the down pulse signal is activated when the frequency of the feedback signal is lower than the frequency of the reference clock signal, and the up pulse signal and the down pulse signal have a same pulse width; a charge pump that receives the up pulse signal and the down pulse signal to generate a pumping signal, wherein the pumping signal is increased when the up pulse signal is activated, and is decreased when the down pulse signal is activated; and a low pass filter configured to perform a low pass filtering on the pumping signal and generate the frequency error signal.

The voltage conversion block may include the power switch configured to be turned on when the power driving signal is activated; a rectifying switch that receives a rectifying driving signal from the switching control block to control an output of the power switch; and a preliminary terminal disposed between the power switch and the rectifying switch, wherein the rectifying switch is configured to decrease a voltage of the preliminary terminal during a period in which the power switch is turned off; an output terminal that is connected with the preliminary terminal to generate the converted output voltage; an inductor disposed between the preliminary terminal and the output terminal; and an output capacitor configured to be charged with a charge of the output terminal.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the present invention. Thus, the scope of the present invention is not limited to these particular following embodiments.

The terminology used herein is for the purpose of describing particular embodiments only and is not intended to be limiting of the invention. As used herein, the singular forms "a", an and the are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Figure 1:
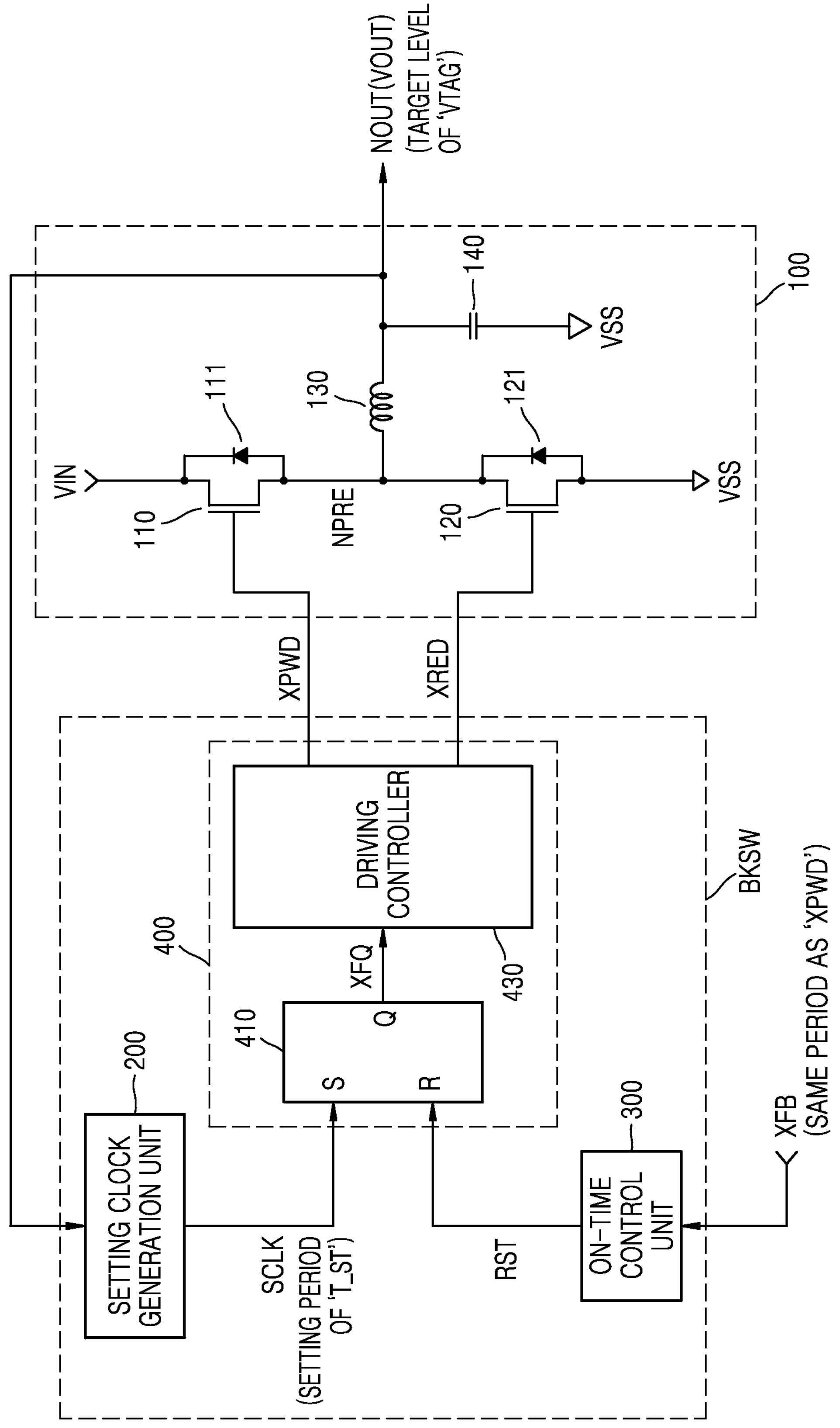
FIG. 1 is a diagram illustrating a DC-to-DC voltage converter according to an embodiment of the present invention.

FIG. 1 is a diagram illustrating a DC-to-DC voltage converter according to an embodiment of the present invention.

Referring to FIG. 1, a DC-to-DC voltage converter according to an embodiment of the present invention includes a voltage conversion block 100 and a switching control block BKSW.

The voltage conversion block 100 includes a power switch 110 which is turned on when a power driving signal XPWD is activated. The voltage conversion block 100 receives an input supply voltage VIN. When the power switch 110 is turned on, the voltage conversion block 100 generates the received input supply voltage VIN as a converted output voltage VOUT having a target level VTAG. In this embodiment, a level of the converted output voltage VOUT may vary depending on a duty cycle of the power driving signal XPWD.

In this embodiment, the voltage conversion block 100 also includes a preliminary terminal NPRE, an output terminal NOUT, the power switch 110, a rectifying switch 120, an inductor 130, and an output capacitor 140.

The power switch 110 is controlled by the power driving signal XPWD provided from the switching control block BKSW.

For example, the power switch 110 is turned on when the power driving signal XPWD is activated, and at this time the input supply voltage VIN provided from a power supply is applied to the preliminary terminal NPRE.

In this exemplary embodiment, the power switch 110 is implemented with a metal oxide semiconductor (MOS) transistor which is gated by the power driving signal XPWD and provides the input supply voltage VIN to the preliminary terminal NPRE. In this embodiment, the power switch 110 operates as an upper switch of controlling a current of the inductor 130.

In FIG. 1, the voltage conversion block 100 also includes a power diode 111 that may be implemented with a P-N junction diode which is parasitic in the power switch 110. The power diode 111 may be maintained as a reverse-bias in a normal buck converting operation.

In this embodiment, the rectifying switch 120 decreases a voltage of the preliminary terminal NPRE during a period in which the power switch 110 is turned off.

For example, the rectifying switch 120 is controlled by a rectifying driving signal XRED provided from the switching control block BKSW. The rectifying driving signal XRED may have an inverted phase of a phase of the power driving signal XPWD and be activated not to overlap with the power driving signal XPWD.

For example, the rectifying switch 120 is implemented with a MOS transistor which is gated by the rectifying driving signal XRED and decreases a voltage of the preliminary terminal NPRE to a ground voltage VSS. In this embodiment, the rectifying switch 120 may operate as a lower switch of controlling the current of the inductor 130.

In FIG. 1, the voltage conversion block 100 also includes a rectifying diode 121 that may be implemented with a P-N junction diode which is parasitic in the rectifying switch 120. The rectifying diode 121 may be maintained as a reverse-bias in the normal buck converting operation.

In this embodiment, the inductor 130 is formed between the preliminary terminal NPRE and the output terminal NOUT, and the output capacitor 140 is charged with a charge of the output terminal NOUT. The level of the converted output voltage VOUT depends on a charge amount of the output terminal NOUT charged in the output capacitor 140.

For example, when controlling a switching and an on-time of the power switch 110, the current of the inductor 130 is controlled. The level of the converted output voltage VOUT is controlled by controlling the current of the inductor 130.

In other words, the level of the converted output voltage VOUT varies in proportion to the switching and the on-time of the power switch 110, that is, a duty cycle of the power driving signal XPWD, as shown in the following Equation.

[Equation]

$$Vout = D \times Vin = (t\_on/T) \times Vin$$

Here, 'Vout' represents the level of the converted output voltage, 'D' represents the duty cycle of the power driving signal XPWD, Win' represents a level of the input supply voltage VIN, and 'T' represents a switching period of the power driving signal XPWD. Further, 't_on' represents a time in which the power driving signal XPWD is activated, that is, a time in which the power switch 110 is turned on, during each switching period T.

The switching control block BKSW will be described with reference to FIG. 1.

In this exemplary embodiment, the switching control block BKSW controls the duty cycle of the power driving signal XPWD based on a frequency of a feedback signal XFB. The feedback signal XFB may be set to have the same frequency or period as that of the power driving signal XPWD. For example, the feedback signal XFB is identical with the power driving signal XPWD. However, the feedback signal XFB may have various forms of signal. For example, the feedback signal XFB may be an arbitrary signal generated by the switching control block BKSW to control the activation of the power driving signal XPWD. Further, the feedback signal XFB may be a signal of the preliminary terminal NPRE provided from the power switch 110.

In this embodiment, the switching control block BKSW includes a setting clock generation unit 200, an on-time control unit 300, and a driving control unit 400.

The setting clock generation unit 200 generates a setting clock signal SCLK. The setting clock signal SCLK may be set to have a setting period T_ST when the converted output voltage VOUT has the target level.

Figure 2:
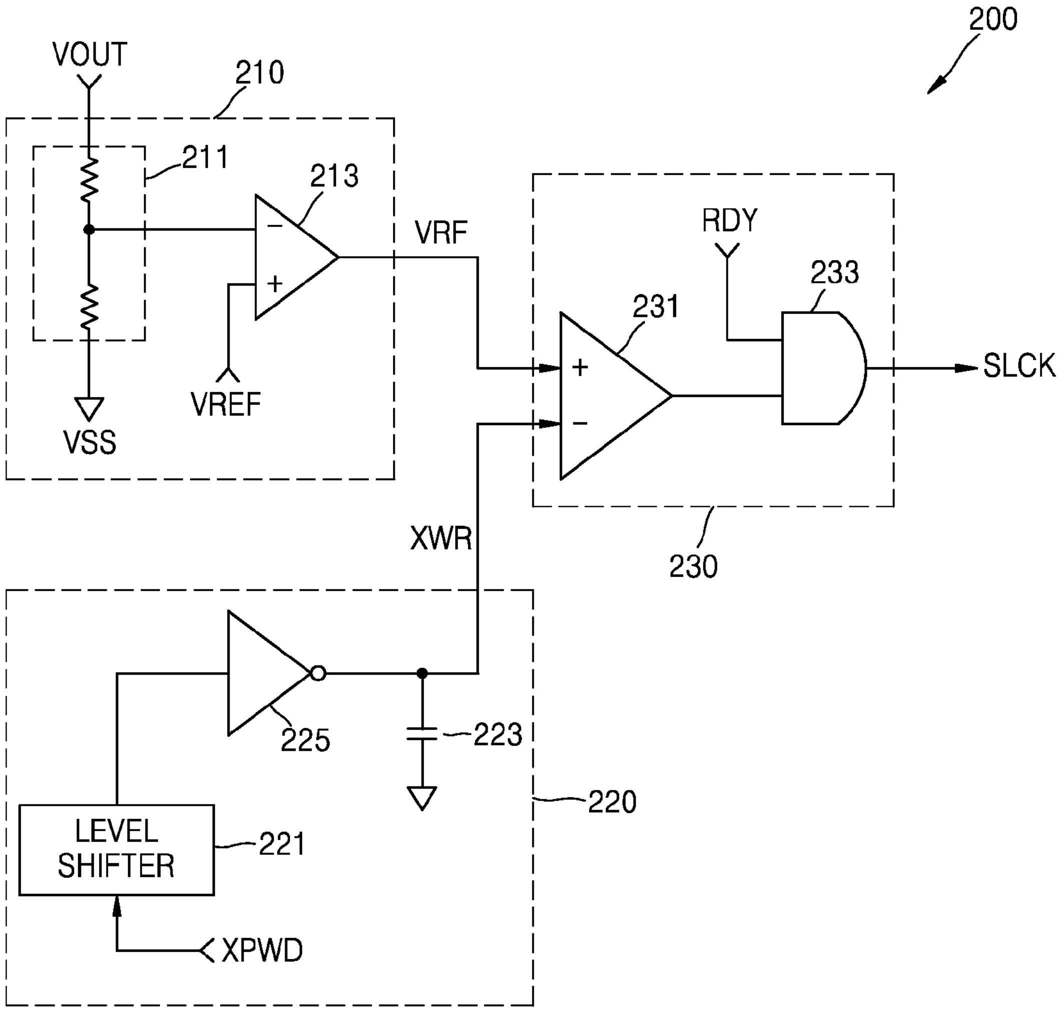
FIG. 2 is a diagram illustrating a setting clock generation unit of FIG. 1 according to an embodiment of the present invention.

FIG. 2 is a diagram illustrating a setting clock generation unit 200 of FIG. 1 according to an embodiment of the present invention. Referring to FIG. 2, the setting clock generation unit 200 includes an output voltage reflector 210, a waveform generator 220, and a setting clock generator 230.

The output voltage reflector 210 receives the converted output voltage VOUT and provides a reflection voltage VRF. A level of the reflection voltage VRF may reflect the level of the converted output voltage VOUT.

In this embodiment, the output voltage reflector 210 includes a voltage divider 211 and a reflection comparator 213.

The voltage divider 211 is configured to divide the converted output voltage VOUT. The reflection comparator 213 receives an output of the voltage divider 211 through a negative (−) input terminal, receives a reference voltage VREF through a positive (+) input terminal, and provides the reflection voltage VRF through an output terminal.

In this embodiment, the level of the reflection voltage VRF is increased as the level of the converted output voltage VOUT is decreased.

The waveform generator 220 generates a reference waveform signal XWR. In this embodiment, the waveform generator 220 includes a level shifter 221, a waveform capacitor 223, and a driver 225.

The level shifter 221 receives the power driving signal XPWD, and shifts the level of the power driving signal XPWD. The signal input to the level shifter 221 may have various forms of signal, for example, having the same period as the power driving signal XPWD.

The waveform capacitor 223 is charged with a charge of an output of the level shifter 221. The driver 225 inverts and drives the output of the level shifter 221, and discharges the charge charged in the waveform capacitor 223.

In this embodiment of the waveform generator 220, a level of the reference waveform signal XWR is decreased by lapse of time when the power driving signal XPWD is activated.

The setting clock generator 230 receives the reflection voltage VRF and the reference waveform signal XWR to generate the setting clock signal SCLK. The setting clock signal SCLK is controlled by a result obtained by comparing the levels of the reflection voltage VRF and the reference waveform signal XWR.

In this embodiment, the setting clock generator 230 includes a setting comparator 231 and an AND gate 233. The setting comparator 231 receives the reflection voltage VRF through a positive (+) input terminal and the reference waveform signal XWR through a negative (−) input terminal.

The AND gate 233 provides an output corresponding to an output of the setting comparator 231 in a state that a ready signal RDY is activated.

In this embodiment of the setting clock generation unit 200, a period of the setting clock signal SCLK is increased as the level of the converted output voltage VOUT is increased from a first level (for example, 1V) to a second level (for example, 2V). On the other hand, the period of the setting clock signal SCLK is gradually decreased as the level of the converted output voltage VOUT is decreased.

When the converted output voltage VOUT is recovered to the first level (or the target level VTAG), the period of the setting clock signal SCLK is recovered to the setting period T_ST.

Referring to FIG. 1 again, the on-time control unit 300 receives the feedback signal XFB and generates a reset driving signal RST. An activation time on which the reset driving signal RST is activated may vary depending on a frequency of the feedback signal XFB.

Figure 3:
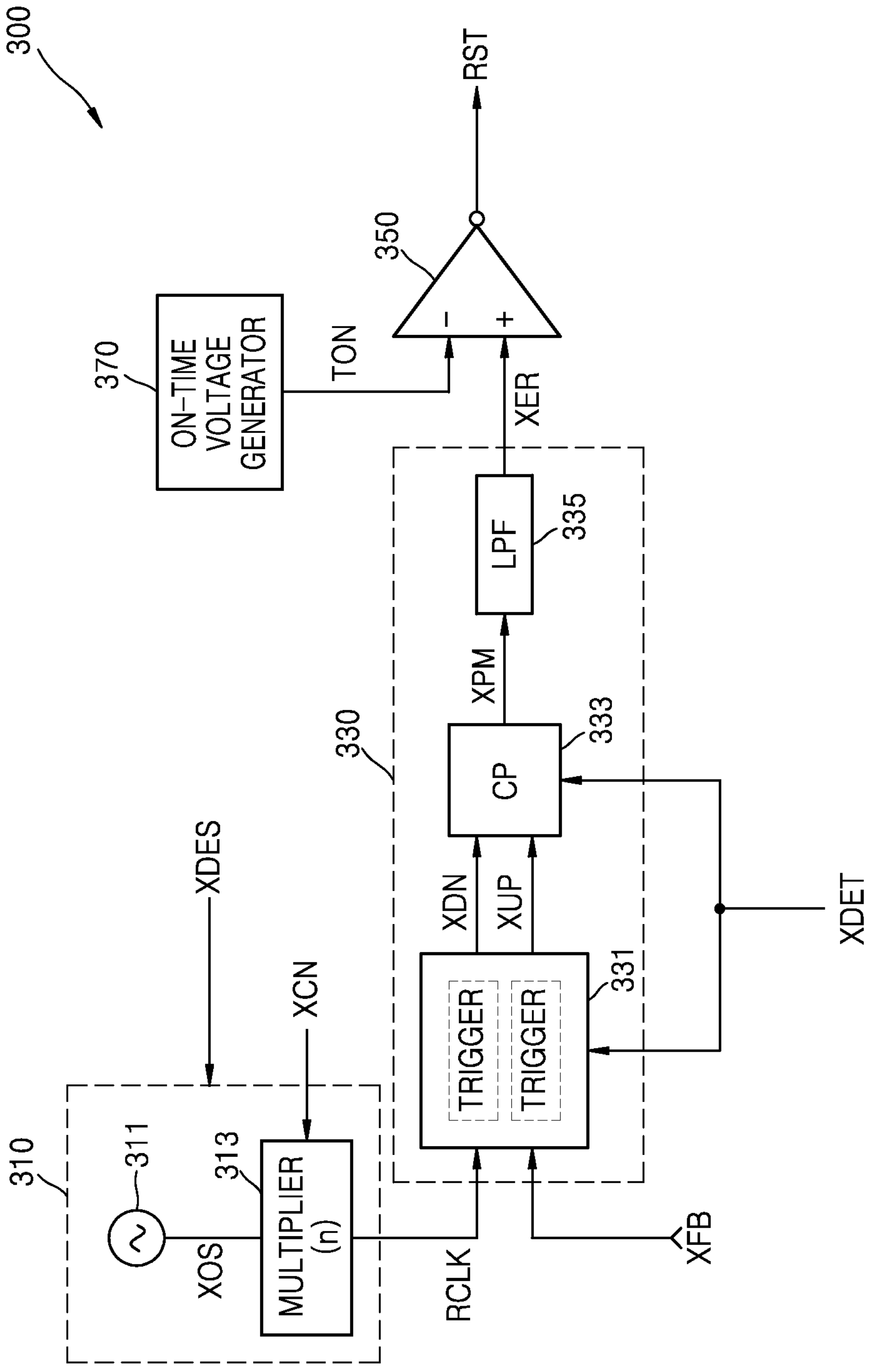
FIG. 3 is a diagram illustrating an on-time control unit of FIG. 1 according to an embodiment of the present invention.

FIG. 3 is a diagram illustrating an on-time control unit 300 of FIG. 1 according to an embodiment of the present invention. Referring to FIG. 3, the on-time control unit 300 includes a reference clock generator 310, a frequency error detector 330, and an on-time comparator 350.

The reference clock generator 310 generates a reference clock signal RCLK. In this embodiment, the reference clock generator 310 includes an oscillator 311 and a multiplier 313.

The oscillator 311 generates an oscillation signal XOS of oscillating with a constant frequency.

For example, when the level of the converted output voltage VOUT is in an error range outside the target level VTAG, the oscillator 311 is disabled in response to a multiplier disable signal XDES. In this case, a current consumed in the oscillator 311 is reduced.

The multiplier 313 performs multiplication of a frequency of the oscillation signal XOS by a predetermined multiplication rate 'n' to generate the reference clock signal RCLK. The multiplication rate 'n' of the multiplier 313 is controlled by a multiplication rate control signal XCN.

The frequency error detector 330 receives the reference clock signal RCLK and the feedback signal XFB and generates a frequency error signal XER. In this embodiment, a voltage level of the frequency error signal XER is changed based on a comparison result of a frequency of the reference clock signal RCLK and the frequency of the feedback signal XFB.

In this exemplary embodiment, the frequency error detector 330 includes a frequency detector 331, a charge pump 333, and a low pass filter 335.

The frequency detector 331 is configured to detect frequencies of the reference clock signal RCLK and the feedback signal XFB to generate an up pulse signal XUP and a down pulse signal XDN.

The up pulse signal XUP may be activated when the frequency of the feedback signal XFB is higher than the frequency of the reference clock signal RCLK. The down pulse signal XDN may be activated when the frequency of the feedback signal XFB is lower than the frequency of the reference clock signal RCLK.

For example, the up pulse signal XUP may have the same pulse width as the down pulse signal XDN.

The charge pump 333 generates a pumping signal XPM using the up pulse signal XUP and the down pulse signal XDN. A level of the pumping signal XPM is increased in response to the pulse of the up pulse signal XUP and decreased in response to the pulse of the down pulse signal XDN.

For example, when the level of the converted output voltage VOUT is in the error range outside the target level VTAG, the frequency detector 331 and the charge pump 333 are disabled in response to an on-time disable signal XDET. In this case, a voltage level of the pumping signal XPM may be maintained by the charge pump 333. A consumed current is reduced since the frequency detector 331 and the charge pump 333 are disabled.

The low pass filter 335 performs a low-pass filtering on the pumping signal XPM to generate the frequency error signal XER.

In this embodiment of the frequency error detector 330, the voltage level of the frequency error signal XER is decreased when the frequency of the feedback signal XFB is lower than that of the reference clock signal RCLK. When the frequency of the feedback signal XFB is the same as that of the reference clock signal RCLK, the voltage level of the frequency error signal XER is maintained as it is.

The on-time comparator 350 compares the on-time voltage TON and the frequency error signal XER to generate the reset driving signal RST. In this embodiment, the on-time comparator 350 receives the on-time voltage TON through a negative (−) terminal, receives the frequency error signal XER through a positive (+) terminal, and provides the reset driving signal RST through an output terminal.

The on-time voltage TON provided from an on-time voltage generator 370 has a level changed in one direction by the lapse of time in a predetermined unit period.

Figure 4:
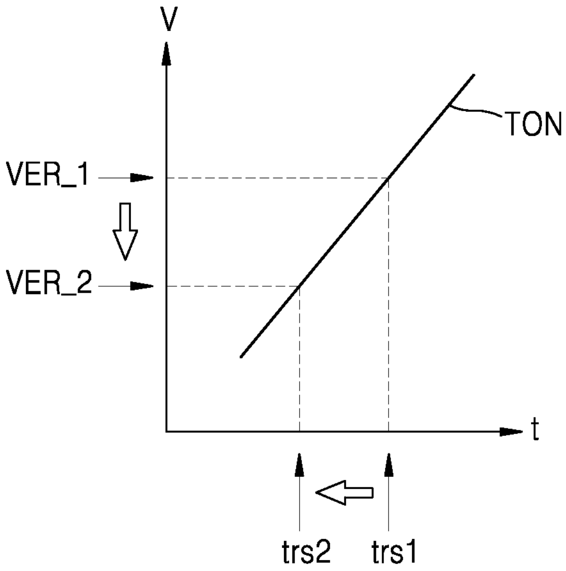
FIG. 4 is a diagram for describing an on-time voltage of FIG. 3 according to an embodiment of the present invention.

In this embodiment, the on-time voltage TON has a level that increases in accordance with the lapse of time, as shown in FIG. 4.

For example, when the voltage level of the frequency error signal XER is decreased from VER 1 to VER 2, the activation time of the reset driving signal RST is advanced from trs1 to trs2.

Accordingly, in this embodiment, when the frequency of the feedback signal XFB is lower than that of the reference clock signal RCLK, the activation time of the reset driving signal RST is advanced.

Referring to FIG. 1 again, the driving control unit 400 generates the power driving signal XPWD and the rectifying driving signal XRED using the setting clock signal SCLK and the reset driving signal RST.

The power driving signal XPWD is activated in response to the setting clock signal SCLK and deactivated when the reset driving signal RST is activated.

As a result, when the frequency of the feedback signal XFB is lower than that of the reference clock signal RCLK, the on-time of the power driving signal XPWD may be decreased.

In this embodiment, the driving control unit 400 includes a flip-flop 410 and a driving controller 430.

The flip-flop 410 generates a flop output signal XFQ in response to the setting clock signal SCLK and the reset driving signal RST. The flop output signal XFQ is activated when the setting clock signal SCLK is activated and deactivated in response to the reset driving signal RST.

For example, the flip-flop 410 is an RS flip-flop of receiving the setting clock signal SCLK through a setting terminal S, receiving the reset driving signal RST through a reset terminal R, and providing the flop output signal XFQ through an output terminal Q. The flip-flop 410 may be driven as logic states shown in the following Table.

TABLE

| S | R | Q(i + 1) |
|---|---|---|
| 0 | 0 | Q(i) |
| 0 | 1 | 0 |
| 1 | 0 | 1 |
| 1 | 1 | invalid |

The driving controller 430 generates the rectifying driving signal XRED together with the power driving signal XPWD synchronized with the flop output signal XFQ.

For example, the power driving signal XPWD may be synchronized with the flop output signal XFQ at the same phase. The power switch 110 of the voltage conversion block 100 is turned on while the flop output signal XFQ is activated and be turned off while the flop output signal XFQ is deactivated.

Figure 5:
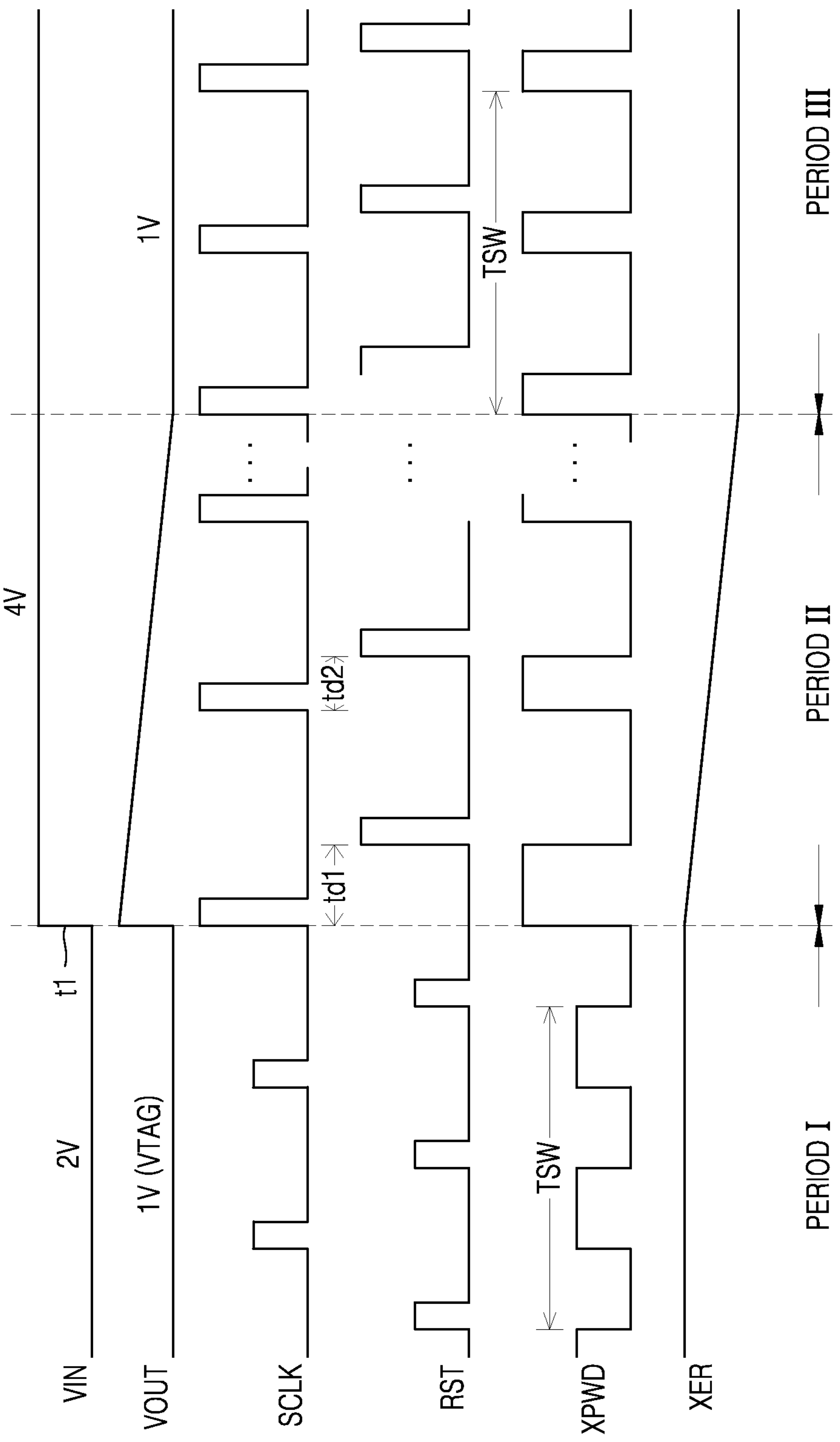
FIG. 5 is a graphical view of signal waveforms of various signals associated with the DC-to-DC voltage converter of FIG. 1 according to an embodiment of the present invention.

Referring to FIG. 5, a process in which the level of the converted output voltage VOUT is recovered with respect to the change of the level of the input supply voltage VIN in the DC-to-DC voltage converter of an embodiment of the present invention will be described.

In the exemplary embodiment of FIG. 5, the target level VTAG of the converted output voltage VOUT is set to 1V.

Period I represents a period before a level of the input supply voltage VIN is changed. In Period I, the input supply voltage VIN has a level of 2V, a duty cycle of the power driving signal XPWD is 50%, and a switching period of the power driving signal XPWD is denoted as 'TSW'.

As shown in FIG. 5, at time t1 the input supply voltage VIN is increased to 4V. At this time, the duty cycle of the power driving signal XPWD is 50%. Therefore, at time t1 the level of the converted output voltage VOUT is increased to 2V.

In this exemplary embodiment, the level of the converted output voltage VOUT is immediately increased to 2V at time t1. However, the level of the converted output voltage VOUT may gradually change instead of the immediate change.

Period II represents a period in which the converted output voltage VOUT is recovered from the increase.

In Period II, a period of the setting clock signal SCLK is increased at the beginning since the level of the converted output voltage VOUT is increased. In this embodiment, as the period of the power driving signal XPWD is increased, a frequency of the feedback signal XFB is decreased, and a level of the frequency error signal XER is decreased.

Accordingly, the activation time of the setting clock signal SCLK is advanced, and an interval between the activation time of the setting clock signal SCLK and the activation time of the reset driving signal RST is reduced from td1 to td2, as shown in FIG. 5. As a result, the duty cycle of the power driving signal XPWD is reduced, and the level of the converted output voltage VOUT is decreased.

The above process of Period II may be repeated until the level of the converted output voltage VOUT is recovered to the target level VTAG.

Period III represents a period after the level of the converted output voltage VOUT is recovered to the target level VTAG. In Period III, the input supply voltage VIN has a level of 4V, but the duty cycle of the power driving signal XPWD may be change to 25%. Accordingly, the converted output voltage VOUT is recovered to the target level VTAG of 1V. At this time, the switching period of the power driving signal XPWD is equal to the switching period TSW in Period I.

That is, the switching frequency of the power driving signal XPWD in Period III which is a period after the recovery of the level of the converted output voltage VOUT is equal to that of Period I which is a period before the change of the level of the input supply voltage VIN.

Consequently, in the DC-to-DC voltage converter of an embodiment of the present invention described above, when the level of the input supply voltage VIN is changed, the converted output voltage VOUT can be recovered to the target level VTAG by detecting the switching frequency of the power driving signal XWPD since the switching frequency is maintained at the same or substantially similar value as before the change of the level of the input supply voltage VIN.

Electronic devices adopting the DC-to-DC voltage converter of the present invention may easily cope with electromagnetic interference (EMI), and noise due to a low frequency coupling may be removed by preventing the switching frequency from being decreased by maintaining a constant switching frequency.

In the DC-to-DC voltage converter of an embodiment of the present invention, when the level of the input supply voltage VIN is changed the converted output voltage can be recovered to the target level using switching frequency detection, while the switching frequency of the power driving signal is maintained at the same or substantially similar value as before the change of the level of the input supply voltage.

Accordingly, electronic devices adopting the DC-to-DC voltage converter of an embodiment of the present invention may not require a separate compensation circuit for stabilization, can be strong against an EMI phenomenon since the switching frequency is stabilized together with a fast response time due to nonlinear control, and can be maximally excluded from interference with respect to a peripheral circuit generated as the switching frequency is decreased.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A direct current to direct current (DC-to-DC) voltage converter, comprising:

a voltage conversion block that receives an input supply voltage from a power supply and outputs a converted output voltage, the voltage conversion block including a power switch configured to be turned on in response to a power driving signal and to provide the input supply voltage to be output as the converted output voltage when the power switch is turned on, wherein the converted output voltage has a level that varies depending on a duty cycle of the power driving signal; and a switching control block that receives the converted output voltage and a feedback signal to control the duty cycle of the power driving signal based on a frequency of the feedback signal, wherein the feedback signal and the power driving signal have a same period, wherein the switching control block comprises:

a setting clock generation unit that receives the converted output voltage and the power driving signal to generate a setting clock signal, wherein the setting clock signal has a setting period when the level of the converted output voltage is a first level, a period of the setting clock signal is changed when the level of the converted output signal is changed from the first level to a second level, and the period of the setting clock signal is recovered to the setting period when the converted output voltage is recovered to the first level;

an on-time control unit that receives the feedback signal to generate a reset driving signal, wherein an activation time of the reset driving signal varies depending on a frequency of the feedback signal; and a driving control unit that receives the setting clock signal and the reset driving signal to generate the power driving signal, wherein the power driving signal is activated in response to the setting clock signal and is deactivated in response to the reset driving signal.

2. The DC-to-DC voltage converter of claim 1, wherein the feedback signal is the power driving signal.

3. The DC-to-DC voltage converter of claim 1, wherein the feedback signal controls activation of the power driving signal.

4. The DC-to-DC voltage converter of claim 1, wherein the setting clock generation unit comprises:

an output voltage reflector that receives the converted output voltage and a reference voltage to provide a reflection voltage, wherein a level of the reflection voltage varies depending on the level of the converted output voltage;

a waveform generator that receives the power driving signal to generate a reference waveform signal, wherein the reference waveform signal is repeatedly generated by a predetermined period and has a level changing in one direction by lapse of time; and a setting clock generator that receives the reflection voltage and the reference waveform signal to generate the setting clock signal, wherein the setting clock signal is controlled based on a comparison result of the reflection voltage and the reference waveform signal.

5. The DC-to-DC voltage converter of claim 4, wherein the output voltage reflector comprises:

a voltage divider that receives the converted output voltage to generate a divided voltage; and a reflection comparator that receives the divided voltage and the reference voltage to generate the reflection voltage by performing a comparison with respect to the divided voltage and the reference voltage.

6. The DC-to-DC voltage converter of claim 4, wherein the waveform generator comprises:

a level shifter that receives the power driving signal to shift a level of the power driving signal;

a driver that receives and drives an output of the level shifter to provides the reference waveform signal to the setting clock generator; and a waveform capacitor disposed at an output of the driver to be charged with a charge of the output of the level shifter.

7. The DC-to-DC voltage converter of claim 4, wherein the setting clock generator comprises:

a setting comparator that receives the reflection voltage and the reference waveform signal to generate the comparison result of the reflection voltage and the reference waveform signal; and an AND gate that receives an output signal of the setting comparator and a ready signal to generate the setting clock signal, wherein the output signal of the setting comparator is generated as the setting clock signal in a state that a ready signal is activated.

8. The DC-to-DC voltage converter of claim 1, wherein the on-time control unit comprises:

a reference clock generator configured to generate a reference clock signal;

a frequency error detector that receives the reference clock signal and the feedback signal to generate a frequency error signal, wherein a voltage level of the frequency error signal is changed based on a comparison result of a frequency of the reference clock signal and a frequency of the feedback signal; and an on-time comparator that receives an on-time voltage and the frequency error signal to generate the reset driving signal by comparing a level of the on-time voltage and a level of the frequency error signal, wherein the level of the on-time voltage is changed in one direction by lapse of a time, and the activation time of the reset driving signal varies depending on the level of the frequency error signal.

9. The DC-to-DC voltage converter of claim 8, wherein the reference clock generator comprises:

an oscillator configured to generate an oscillation signal oscillating with a predetermined frequency; and a multiplier that receives the oscillation signal and multiplies a frequency of the oscillation signal by a multiplication rate to generate the reference clock signal having a reference frequency.

10. The DC-to-DC voltage converter of claim 9, wherein the multiplier receives a multiplication rate control signal to control the multiplication rate.

11. The DC-to-DC voltage converter of claim 9, wherein the oscillator is disabled when the level of the converted output voltage is in an error range outside a target level.

12. The DC-to-DC voltage converter of claim 8, wherein the frequency error detector comprises:

a frequency detector that receives the reference clock signal and the feedback signal to detect the frequencies of the reference clock signal and the feedback signal and generate an up pulse signal and a down pulse signal, wherein the up pulse signal is activated when the frequency of the feedback signal is higher than the frequency of the reference clock signal, the down pulse signal is activated when the frequency of the feedback signal is lower than the frequency of the reference clock signal, and the up pulse signal and the down pulse signal have a same pulse width;

a charge pump that receives the up pulse signal and the down pulse signal to generate a pumping signal, wherein the pumping signal is increased when the up pulse signal is activated, and is decreased when the down pulse signal is activated; and a low pass filter configured to perform a low pass filtering on the pumping signal and generate the frequency error signal.

13. The DC-to-DC voltage converter of claim 12, wherein the frequency detector is disabled when the level of the converted output voltage is in an error range outside a target level.

14. The DC-to-DC voltage converter of claim 12, wherein the charge pump is disabled when the level of the converted output voltage is in an error range outside a target level.

15. The DC-to-DC voltage converter of claim 1, wherein the driving control unit comprises:

a flip-flop configured to generate a flop output signal in response to the setting clock signal and the reset driving signal, wherein the flop output signal is activated when the setting clock signal is activated and deactivated when the reset driving signal is activated; and a driving controller that receives the flop output signal to generate the power driving signal synchronized with the flop output signal.

16. The DC-to-DC voltage converter of claim 15, wherein the flip-flop is an RS flip-flop that receives the setting clock signal through a setting terminal, the reset driving signal through a reset terminal, and outputting the flop output signal through an output terminal.

17. A direct current to direct current (DC-to-DC) voltage converter, comprising:

a voltage conversion block that receives an input supply voltage from a power supply and outputs a converted output voltage, the voltage conversion Hock including a power switch configured to be turned on in response to a power driving signal and to provide the input supply voltage to be output as the converted output voltage when the power switch is turned on, wherein the converted output voltage has a level that varies depending on a duty cycle of the power driving signal; and a switching control block that receives the converted output voltage and a feedback signal to control the duty cycle of the power driving signal based on a frequency of the feedback signal, wherein the feedback signal and the power driving signal have a same period, wherein the voltage conversion block comprises:

the power switch configured to be turned on when the power driving signal is activated;

a rectifying switch that receives a rectifying driving signal from the switching control block to control an output of the power switch;

a preliminary terminal disposed between the power switch and the rectifying switch, wherein the rectifying switch is configured to decrease a voltage of the preliminary terminal during a period in which the power switch is turned off; and an output terminal that is connected with the preliminary terminal to generate the converted output voltage.

18. The DC-to-DC voltage converter of claim 7, wherein the voltage conversion block further comprises:

an inductor disposed between the preliminary terminal and the output terminal; and an output capacitor configured to be charged with a charge of the output terminal.

* * * * *